(12) United States Patent
Hino (10) Patent No.: US 10,615,131 B2
(45) Date of Patent: Apr. 7, 2020

(54) SEMICONDUCTOR DEVICE WITH HIGH QUALITY AND RELIABILITY WIRING CONNECTION, AND METHOD FOR MANUFACTURING THE SAME

(71) Applicant: Mitsubishi Electric Corporation, Tokyo (JP)

(72) Inventor: Yasunari Hino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 31 days.

(21) Appl. No.: 16/112,824

(22) Filed: Aug. 27, 2018

(65) Prior Publication Data

US 2019/0122998 A1 Apr. 25, 2019

(30) Foreign Application Priority Data

Oct. 24, 2017 (JP) ................. 2017-205040

(51) Int. Cl.
*H01L 23/00* (2006.01)
*H01L 25/07* (2006.01)
(Continued)

(52) U.S. Cl.
CPC ........ *H01L 23/562* (2013.01); *H01L 21/4875* (2013.01); *H01L 21/565* (2013.01); *H01L 23/053* (2013.01); *H01L 23/24* (2013.01); *H01L 23/3107* (2013.01); *H01L 23/367* (2013.01); *H01L 23/3735* (2013.01); *H01L 23/50* (2013.01); *H01L 24/29* (2013.01); *H01L 24/83* (2013.01); *H01L 25/072* (2013.01); *H01L 23/3121* (2013.01); *H01L 2224/29111* (2013.01); *H01L 2224/29139* (2013.01); *H01L 2224/29147* (2013.01);
(Continued)

(58) Field of Classification Search
CPC . H01L 21/4875; H01L 21/565; H01L 23/053; H01L 23/24; H01L 23/3107; H01L 23/367; H01L 23/3735; H01L 23/50; H01L 23/562; H01L 24/29; H01L 24/83; H01L 25/072
See application file for complete search history.

(56) References Cited

U.S. PATENT DOCUMENTS

| 6,319,751 | B1 * | 11/2001 | Lin ............................... 438/108 |
| 8,450,845 | B2 * | 5/2013 | Ikeda et al. ................... 257/712 |
| 2007/0172980 | A1 | 7/2007 | Tanaka et al. |

FOREIGN PATENT DOCUMENTS

JP 2007-227893 A 9/2007

* cited by examiner

*Primary Examiner* — Andrew Q Tran
(74) *Attorney, Agent, or Firm* — Studebaker & Brackett PC (57) ABSTRACT

The semiconductor device includes a metal plate, a semiconductor element held on the metal plate, a wiring board connected to a surface electrode of the semiconductor element in a facing manner and a conductor fixed to the wiring board wired to the semiconductor element. The conductor has a plate-like shape. One end of the conductor is arranged to be connectable to an outside. One surface side of another end of the conductor is fixed to a surface of the wiring board. The conductor includes at least one protruding step on the one surface of the other end. A top portion of the protruding step includes a contact surface parallel to the surface of the wiring board. The other end of the conductor is fixed to the wiring board by the contact surface and the surface of the wiring board coming into close contact with each other.

24 Claims, 7 Drawing Sheets

(51) Int. Cl.
*H01L 23/373* (2006.01)
*H01L 23/24* (2006.01)
*H01L 23/053* (2006.01)
*H01L 21/48* (2006.01)
*H01L 21/56* (2006.01)
*H01L 23/31* (2006.01)
*H01L 23/367* (2006.01)
*H01L 23/50* (2006.01)

(52) U.S. Cl.
CPC ............... *H01L 2224/32225* (2013.01); *H01L 2224/32245* (2013.01); *H01L 2224/33181* (2013.01); *H01L 2224/8384* (2013.01); *H01L 2224/83825* (2013.01); *H01L 2924/1033* (2013.01); *H01L 2924/10253* (2013.01); *H01L 2924/10272* (2013.01); *H01L 2924/1203* (2013.01); *H01L 2924/13055* (2013.01); *H01L 2924/13091* (2013.01); *H01L 2924/351* (2013.01)

SEMICONDUCTOR DEVICE WITH HIGH QUALITY AND RELIABILITY WIRING CONNECTION, AND METHOD FOR MANUFACTURING THE SAME

BACKGROUND OF THE INVENTION

Field of the Invention

The present invention relates to a semiconductor device and a method for manufacturing the semiconductor device, and more particularly to a wiring connection technique having high quality bonding property, long life, and high reliability in the semiconductor device.

Description of the Background Art

In recent years, with the rise of environmental regulations, there is an increasing demand for energy saving semiconductor devices that take environmental issues into consideration, that is, semiconductor devices with high energy efficiency. For example, semiconductor devices used for industrial equipment, drive control equipment for home appliances equipped with motors, in-vehicle control equipment for electric vehicles and hybrid vehicles, railway control equipment, control equipment for photovoltaic power generation, and the like are required to cope with high power, high withstand voltage, and high durability. In particular, in semiconductor devices used for in-vehicle control equipment and railway control equipment, from the viewpoint of energy saving and reduction in conversion loss of electric energy, it is required to operate with high efficiency and low loss even under high load environment (high temperature environment). For example, the usual operating temperature so far has been Tj=125° C., 150° C. or less, but in the future it is required to operate in a high temperature environment of Tj=175° C., 200° C. or more.

Thus, it is necessary to reconsider the structure of the semiconductor device in order to achieve low loss by reducing the switching loss and high efficiency in the high temperature state even under the high temperature environment as described above. In particular, the wiring connection portion (junction) in the semiconductor device is most likely to deteriorate, and it is a problem to achieve a wiring connection portion with high quality, high reliability, and long life. In addition, it is also necessary to reduce costs and improve productivity in the bonding process of wiring connection using a laser beam.

Conventionally, solder containing Sn has been used for wiring connection. However, in the internal wiring of the power semiconductor device used under a high temperature environment, the solder containing Sn has a problem in durability. In recent years, development of a bonding material having durability under a high-temperature environment has progressed, but it is difficult to secure a desired life and reliability.

On the other hand, there is a technique of connecting wiring lines by joining using a laser beam. For example, Japanese Patent Application Laid-Open No. 2007-227893 proposes a manufacturing method of a semiconductor device in which a semiconductor chip and a lead frame are joined by laser welding. However, laser joining requires exterior treatment such as Ni plating on the joining surface, which increases the number of steps in the manufacturing process and leads to high cost. In addition, heat generated during laser joining may deteriorate the reliability of the semiconductor element. For this reason, it is technically difficult to practically join the wiring lines to a semiconductor device required to have durability by laser joining.

SUMMARY

It is an object of the present specification to provide a semiconductor device

The semiconductor device in this specification includes: a metal plate; a semiconductor element including a first electrode provided on a front surface and a second electrode provided on a back surface, the semiconductor element being held on the metal plate by the second electrode being connected to the metal plate; a wiring board including a first surface and a second surface facing each other, the first surface being connected to the first electrode of the semiconductor element in a facing a; and a conductor having a plate-like shape, one end of the conductor being arranged to be connectable to an outside, one surface side of another end of the conductor being fixed to the second surface of the wiring hoard, the conductor being wired to the first electrode of the semiconductor element. The conductor includes at least one protruding step on the one surface of the other end. A top portion of the at least one protruding step included in the conductor includes a contact surface parallel to the second surface of the wiring board. The other end of the conductor is fixed to the second surface of the wiring board by the contact surface and the second surface of the wiring board coming into close contact with each other.

According to the present specification, it is possible to provide a semiconductor device having high quality and high reliability with regard to the connection of wiring lines.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of a semiconductor device and a method for manufacturing the semiconductor device will be described.

First Preferred Embodiment (Device Configuration)

Figure 1:
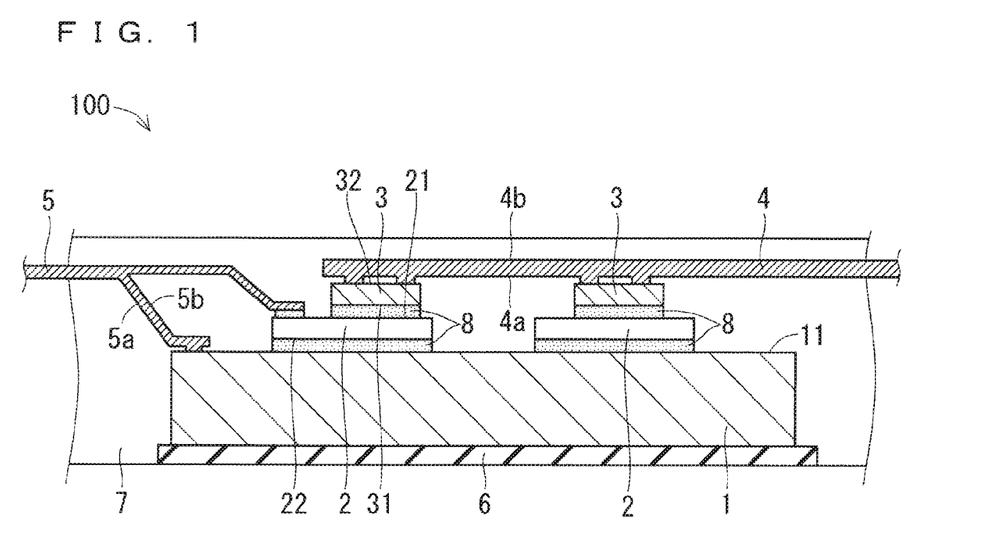
FIG. 1 is a cross-sectional view showing the configuration of a semiconductor device in a first preferred embodiment.
Figure 2:
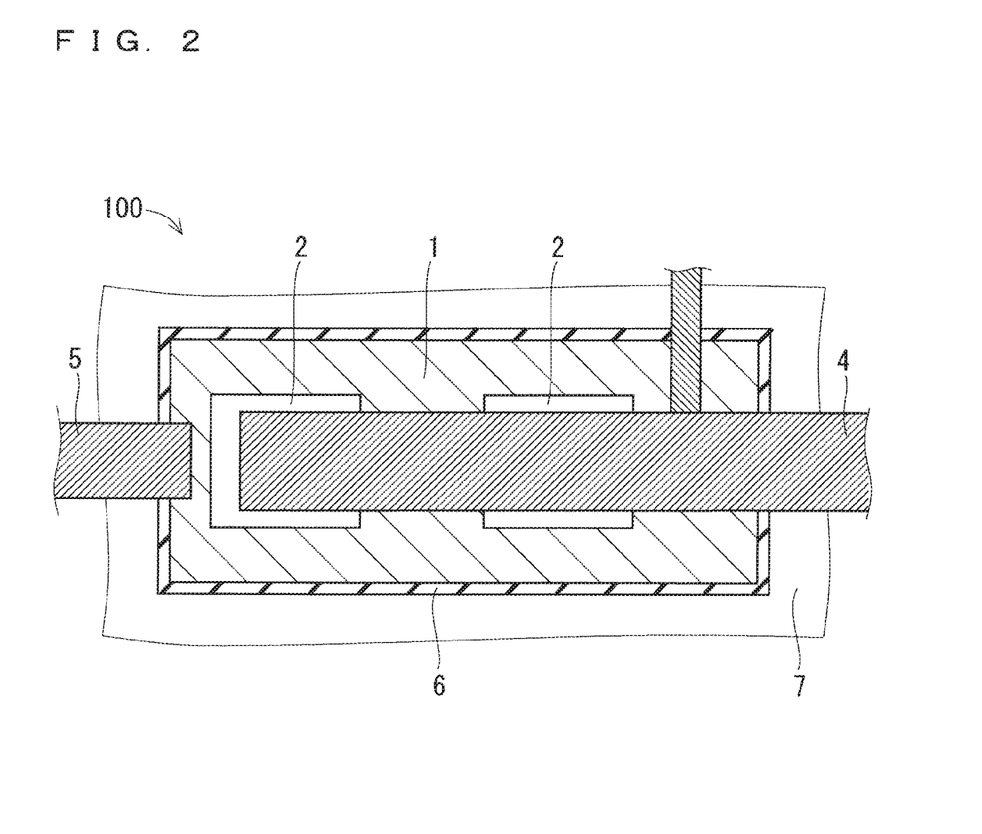
FIG. 2 is a top view showing the configuration of the semiconductor device in the first preferred embodiment.

FIG. 1 is a cross-sectional view showing the configuration of a semiconductor device 100 in a first preferred embodiment. FIG. 2 is a top view showing the configuration of the semiconductor device 100 in the first preferred embodiment. The semiconductor device 100 includes a metal plate 1, a semiconductor element 2, a wiring board 3, a conductor, and another conductor different from the conductor. In the following preferred embodiments, the conductor is referred to as a first conductor 4, and the other conductor is referred to as a second conductor 5. In addition, in the first preferred embodiment, the semiconductor device 100 further includes a heat sink 6 and a sealing material 7.

The metal plate 1 has a function of radiating heat generated in the semiconductor element 2 to the heat sink 6. The metal plate 1 is made of a metal such as copper or a copper alloy having a thermal conductivity of about 400 W/(m·K) and an electrical resistivity of about 2 Ω·cm, for example. The thickness of the metal plate 1 is about 3 to 5 mm.

The semiconductor element 2 is held on the metal plate 1. The semiconductor element 2 has a size of, for example, about 7 mm to 15 mm on one side and is a power semiconductor element that performs switching control of high power. The semiconductor element 2 is, for example, an IGBT (insulated Gate Bipolar Transistor). Alternatively, for example, the semiconductor element 2 is a semiconductor element having a diode function. In the first preferred embodiment, the semiconductor device 100 includes a pair of these two kinds of semiconductor elements. The semiconductor element 2 may be an IGBT made of Si, a metal-oxide-semiconductor field-effect transistor (MOSFET), or a diode, and they may be made of SiC or GaN. The semiconductor element 2 such as the IGBT and the MOSFET has a large calorific value because the semiconductor element 2 controls switching of a large current. Therefore, the semiconductor device 100 is provided with the metal plate 1 having high thermal conductivity and efficiently radiating heat.

The semiconductor element 2 is provided with a first electrode 21 on the front surface and a second electrode 22 on the back surface. When the semiconductor element 2 is an IGBT, a gate electrode and an emitter electrode are arranged on the front surface as the front surface electrodes being the first electrodes 21, and a collector electrode is arranged on the back surface as the back surface electrode being the second electrode 22. Connecting the second electrode 22 on the back surface to one surface 11 of the metal plate 1 holds the semiconductor element 2 on the metal plate 1. The front surface electrode and the back surface electrode are made of alloy such as Ti—Ni—Au. In the first preferred embodiment, the second electrode 22 of the semiconductor element 2 is bonded to the one surface 11 of the metal plate 1 with a bonding material 8. The bonding material 8 is a bonding material having conductivity and containing Ag or Cu.

The wiring board 3 includes a first surface 31 and a second surface 32 facing each other. The wiring board 3 has conductivity and is made of, for example, copper or copper alloy. The first surface 31 of the wiring board 3 is connected to the first electrode 21 of the semiconductor element 2 in a facing manner. In the first preferred embodiment, the first surface 31 of the wiring board 3 is bonded to the first electrode 21 of the semiconductor element 2 via the bonding material 8. The bonding material 8 has conductivity and contains Ag or Cu. The wiring board 3 has a heat capacity. The thickness of the wiring board 3 is preferably 0.1 μm to several mm. The wiring board 3 has a function capable of adjusting the thermal expansion coefficient. Since thermal distortion or thermal stress occurs inside the semiconductor device 100 due to the difference in the thermal expansion coefficient of each member, an adjustment function is necessary to achieve a long life and high reliability.

Figure 3:
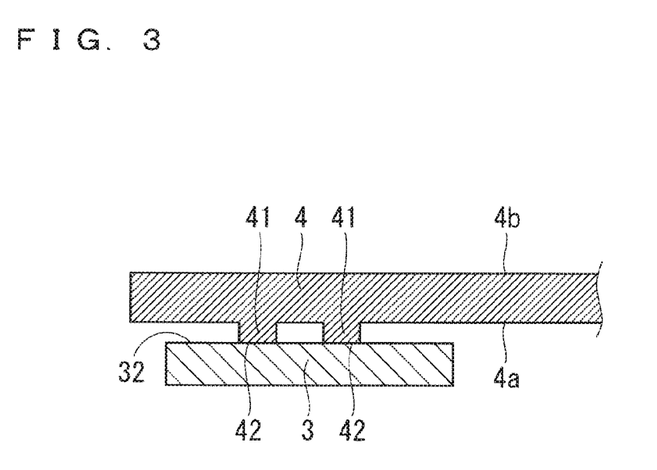
FIG. 3 is an enlarged cross-sectional view showing the configuration of another end of a first conductor in the first preferred embodiment.

The first conductor 4 has a plate-like shape. One end of the first conductor 4 is arranged to be connectable to the outside, and one surface 4a side of the other end is fixed to the second surface 32 of the wiring board 3. The first conductor 4 is wired to the first electrode 21 of the semiconductor element 2 by being connected to the wiring board 3. It should be noted that in FIGS. 1 and 2, illustration of one end is omitted, and only the other end is shown. FIG. 3 is an enlarged cross-sectional view showing the configuration of the other end of the first conductor 4 in the first preferred embodiment. The first conductor 4 includes at least one protruding step 41 on the one surface 4a of the other end. In the first preferred embodiment, two protruding steps 41 are provided. The number of protruding steps provided on the one surface 4a depends on the size of the semiconductor element 2 or the size of the wiring board 3. For example, when the size of the semiconductor element 2 is not so large as to be able to provide a plurality of protruding steps, the first conductor 4 is provided with one protruding step. The top portion of each protruding step 41 includes a contact surface 42 parallel to the second surface 32 of the wiring board 3. The other end of the first conductor 4 is fixed to the second surface 32 of the wiring board 3 by the contact surface 42 and the second surface 32 of the wiring board 3 coming into close contact with each other. It should be noted that in the first preferred embodiment, in the position where each protruding step 41 is provided, the other surface 4h on the opposite side is a flat surface. The first conductor 4 is made of for example, copper or copper alloy, and the first conductor 4 is a flat plate having a thickness of about 0.5 to 2 mm.

Figure 4:
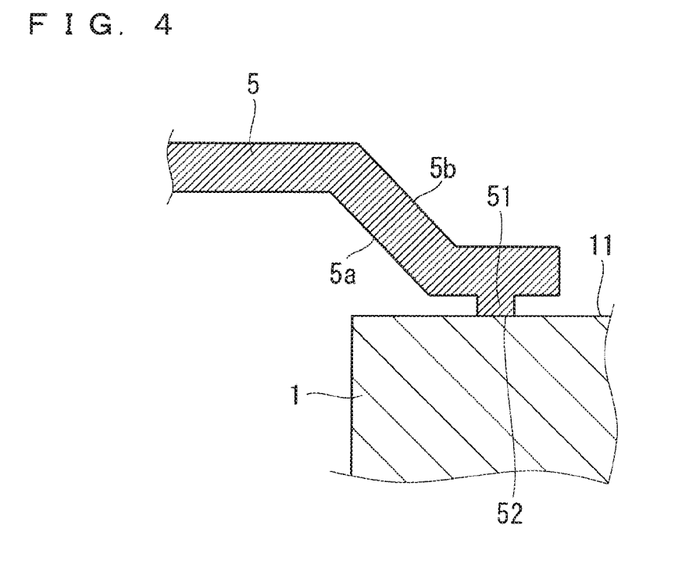
FIG. 4 is an enlarged cross-sectional view showing the configuration of another end of a second conductor in the first preferred embodiment.

The second conductor 5 has a plate-like shape as shown in FIG. 1. One end of the second conductor 5 is arranged to be connectable to the outside, and one surface 5a side of the other end is fixed to the one surface 11 of the metal plate 1. That is, the second conductor 5 is wired to the second electrode 22 of the semiconductor element 2 by being wired to the second electrode 22 of the semiconductor element 2. It should be noted that in FIGS. 1 and 2, illustration of one end is omitted, and only the other end is shown. FIG. 4 is an enlarged cross-sectional view showing the configuration of the other end of the second conductor 5 in the first preferred embodiment. The second conductor 5 includes at least one protruding step 51 on the one surface 5a of the other end. In the first preferred embodiment, one protruding step 51 is provided. The top portion of the protruding step 51 includes a contact surface 52 parallel to the one surface 11 of the metal plate 1. The other end of the second conductor 5 is fixed to the one surface 11 of the metal plate 1 by the contact surface 52 of the second conductor 5 and the one surface 11 of the metal plate 1 coming into close contact with each other. It should be noted that in the first preferred embodiment, in the position where the protruding step 51 is provided, the other surface 5b on the opposite side is a flat surface. The second conductor 5 is made of, for example, copper or copper alloy, and the second conductor 5 is a flat plate having a thickness of about 0.5 to 2 mm.

With the above connection, when the semiconductor element 2 is an IGBT, the emitter electrode (first electrode 21) provided on the front surface is connectable to an external terminal (not shown) via the bonding material 8, the wiring board 3, and the first conductor. The collector electrode (second electrode 22) provided on the back surface of the semiconductor element 2 is connectable to an external terminal (not shown) via the bonding material 8, the metal plate 1, and the second conductor 5. That is, the switching control from outside is performed on the semiconductor element 2 with the first conductor 4 and the second conductor 5.

As shown in FIG. 1, the heat sink 6 is fixed to the back surface of the metal plate 1. The back surface is positioned on the side opposite to the one surface 11 of the metal plate 1 to which the semiconductor element 2 is connected. The heat sink 6 is formed of a laminated structure (not shown) of an insulating layer and a protective metal layer. The insulating layer contains an epoxy resin mixed with a filler such as boron nitride or alumina. The protective metal layer is made of copper, aluminum, or the like having high thermal conductivity. The heat generated by the semiconductor element 2 is radiated through the bonding material 8, the metal plate I, and the heat sink 6. Furthermore, although not shown in the drawing, another heat sink, a heat sink including a plurality of fins, or a water-cooled fin may be connected to the heat sink 6. This configuration improves the heat radiation performance, that is, the cooling performance. As a result, the temperature rise of the semiconductor element 2 is prevented, and the semiconductor element 2 operates with high efficiency, that is, low loss. It should be noted that the heat sink 6 is not necessarily required and depends on the system configuration in which the semiconductor device 100 is used.

The sealing material 7 seals the metal plate 1, the semiconductor element 2, the wiring board 3, the first conductor 4, and the second conductor 5. The sealing material 7 is, for example, a resin.

(Method for Manufacturing Semiconductor Device)

Before the method for manufacturing the semiconductor device 100 in the first preferred embodiment is described, the problems in the method for manufacturing the semiconductor device in the prerequisite technique will be described. Generally, in order to connect the wiring lines from the front surface electrode of the semiconductor element 2 to the external electrode, a metal wire such as aluminum is wired by wire bonding, and the metal wire and the electrode are solid-phase bonded. In a power semiconductor device that performs switching control of a large current, a plurality of metal wires are arranged in parallel, and thick metal wires in which each wire has a wire diameter of about 500 μm have been adopted. However, there is a limit in the electric capacity or the lifetime of the unction handled by the power semiconductor device. As the miniaturization of the power semiconductor device progresses, the size of the semiconductor device is also reduced, so that it is difficult to increase the number of parallel metal wires. In addition, when a metal wire having a larger wire diameter than the conventional metal wire is adopted, it is necessary to bond the metal wire by increasing the pressure and vibration to be applied to the front surface electrode being the bonding surface of the metal wire. If these pressures or stresses are excessive, the semiconductor element may be destroyed. Furthermore, power semiconductor devices need to withstand harsh heat cycles and power cycles. The specification output of the power semiconductor device tends to continue to increase to several hundred volts, then several thousand volts. Regarding wiring connection, it is necessary to cope with high current, stimulate reduction in electric resistance, and to achieve reliability and long life of the junction even under harsh environments.

Figure 5:
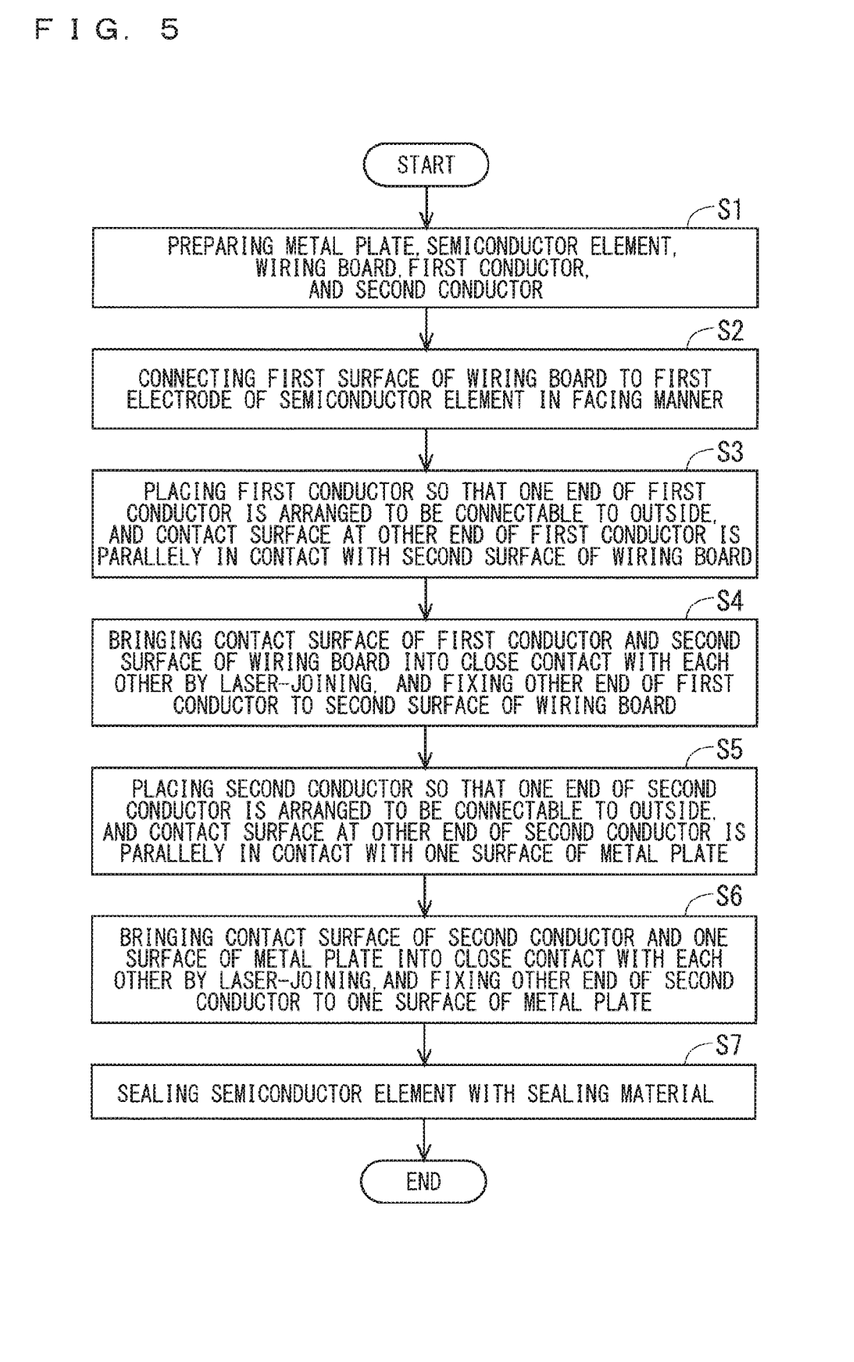
FIG. 5 is a flowchart showing a method for manufacturing the semiconductor device in the first preferred embodiment.

Next, a method for manufacturing the semiconductor device 100 according to the first preferred embodiment will be described. FIG. 5 is a flowchart showing a method for manufacturing the semiconductor device 100 in the first preferred embodiment.

In step S1, the metal plate 1, the semiconductor element 2, the wiring board 3, and the first conductor 4 are prepared. In the first preferred embodiment, the above-described second conductor 5 is also prepared in this step S1. In addition, the semiconductor element 2 to be prepared is held on the metal plate 1 by the second electrode 22 being connected to the metal plate 1. Here, the second electrode 22 of the semiconductor element 2 is bonded to the one surface 11 of the metal plate 1 via the bonding material 8 so as to be held to face the one surface 11 of the metal plate 1. The bonding material 8 is fanned by sintering a sintered material containing Ag or Cu. That is, the second electrode 22 and the metal plate 1 are bonded by low-temperature sintering bonding. In low-temperature sintering bonding, a sintered material containing in solvent metal particles covered with a surface stabilizer such as a protective film is heated, whereby the solvent volatilizes and the metal particles are bonded to each other. The diameter of the metal particle is about several nm to several μm. The metal particle is a particle containing, for example, Ag, Cu, Au, Pd, or Pt. The solvent is, for example, organic solvent. Metal particles having a particle size of nano order cohere with each other at a temperature lower than the melting point of the bulk state due to the surface energy so as to be bonded. The heating temperature is 150° C. to 350° C. Although it is possible to perform sintering bonding without pressurization, pressurization of about 2 MPa to 10 MPa may also be performed if necessary. In the case of sintering without pressurization, the heating time is about 10 to 120 minutes. The bonding material 8 after sintering has a melting point of 900° C. or more and has high heat resistance and reliability. The thickness of the bonding material 8 after sintering is about 20 μm to 200 μm. When (he sintered material is a paste type, the printing step and the drying step of the sintered material are performed before heating. When the sintered material is, a sheet type, the sheet material is mounted in advance, and the printing step and the drying step are unnecessary. The sheet type sintered material has better assembly performance than the conventional paste type sintered material. The thickness of the sheet is a predetermined height being within the range of 40 μm to 400 μm.

In step S2, the first surface 31 of the wiring board 3 is connected to the first electrode 21 of the semiconductor element 2 in a facing manner. Here, the first surface 31 of the wiring board 3 is bonded to the first electrode 21 of the semiconductor element 2 via the bonding material 8. The bonding material 8 and the bonding method in step S2 are also the same as in step S1.

In step S3, the first conductor 4 is placed so that the one end of the first conductor 4 is arranged to be connectable to the outside, and the one surface 4a side of the other end of the first conductor 4 is positioned on the second surface 32 of the wiring board 3. At this time, the contact surface 42 of each protruding step 41 of the first conductor 4 comes into contact with the second surface 32 of the wiring board 3 parallely.

In step S4, the contact surface 42 of each protruding step 41 of the first conductor 4 and the second surface 32 of the wiring board 3 are laser joined to each other. The thermal energy generated by the first conductor 4 absorbing the laser beam melts a part of the first conductor 4 and the wiring board 3, and both are joined. Then, the contact surface 42 of each protruding step 41 and the second surface 32 of the wiring board 3 come into close contact with each other, and the other end of the first conductor 4 is fixed to the second surface 32 of the wiring board 3. Thus, the first conductor 4 is wired to the first electrode 21 of the semiconductor element 2.

The wiring board 3 provided between the first conductor 4 and the semiconductor element 2 prevents heat generated during laser joining from being conducted to the semiconductor element 2. That is, since the heat capacity of the wiring board 3 is large, heat is stored in the wiring board 3. As a result, the destruction of the semiconductor element 2 due to heat can be avoided.

In the first preferred embodiment, the contact surface 42 of each protruding step 41 and the second surface 32 of the wiring board 3 are laser-joined by a laser beam having a wavelength of 500 nm to 1200 nm oscillated from a fiber laser. In conventional laser joining, in order to obtain energy necessary for joining, Ni plating or the like having a laser beam absorptance higher than Cu has been applied to the front surface of the object to be joined. In the manufacturing method of the first preferred embodiment, Cu or an alloy containing Cu forming the first conductor 4 or the second. conductor 5 efficiently absorbs a laser beam having a wavelength of 500 nm to 1200 nm. Therefore, in the laser joining by the fiber laser, exterior treatment such as Ni plating is unnecessary. In addition, it is possible to perform laser joining by irradiating one junction with a laser beam for about several tens of ms to 1 s. Therefore, productivity can be improved and cost reduction can be achieved.

In step S5, the second conductor 5 is placed so that the one end of the second conductor 5 is arranged to be connectable to the outside, and the one surface 5a side of the other end of the second conductor 5 is positioned on the one surface 11 of the metal plate 1. At this time, the contact surface 52 of the protruding step 51 of the second conductor 5 comes into contact with the one surface 11 of the metal plate 1 parallely.

Figure 6:
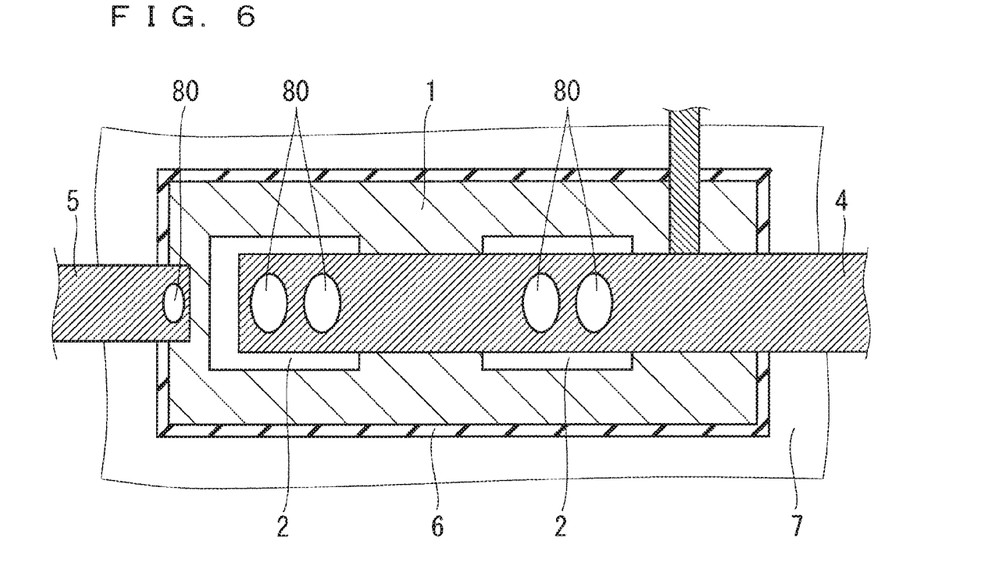
FIG. 6 is a top view showing the configuration of a semiconductor device after laser joining in the first preferred embodiment.

In step S6, the contact surface 52 of the protruding step 51 of the second conductor 5 and the one surface 11 of the metal plate 1 are laser-joined. The thermal energy generated by the second conductor 5 absorbing the laser beam melts a part of the second conductor 5 and the metal plate 1, and both are joined. Then, the contact surface 52 of the protruding step 51 and the one surface 11 of the metal plate. 1 conic into close contact with each other, and the other end of the second conductor 5 is fixed to the one surface 11 of the metal plate 1. Thus, the second conductor 5 is wired to the second electrode 22 of the semiconductor element 2. It should be noted that as in step S4, a fiber laser is used for the laser joining. FIG. 6 is a top view showing the configuration of a semiconductor device 100 after laser joining in the first preferred embodiment. A laser junction 80 is formed in a position corresponding to the contact surface 42 of each protruding step 41 of the first conductor 4 and in a position corresponding to the contact surface 52 of each protruding step 51 of the second conductor 5.

In step S7, the semiconductor element 2 and the like are sealed with a resin, and the heat sink 6 and the metal plate 1 are fixed in close contact with each other. The resin is a sealing material 7 containing epoxy resin as a main component, and the semiconductor element 2 and the like are sealed by transfer molding.

It should be noted that the order in which each step is executed is not limited to the above, and may change.

To summarize the above, the semiconductor device 100 according to the first preferred embodiment includes: a metal plate 1; a semiconductor element 2 including a first electrode 21 provided on a front surface and a second electrode 22 provided on a back surface, the semiconductor element 2 being held on the metal plate 1 by the second electrode 22 being connected to the metal plate 1; a wiring board 3 including a first surface 31 and a second surface 32 facing each other, the first surface 31 being connected to the first electrode 21 of the semiconductor element 2 in a facing manner; and a conductor (first conductor 4) having a plate-like shape, one end of the conductor being arranged to be connectable to an outside, one surface 4a side of another end of the conductor being fixed to the second surface 32 of the wiring board 3, the conductor being wired to the first electrode 21 of the semiconductor element 2. The first conductor 4 includes at least one protruding step 41 on one surface 4a of the other end. The top portion of at least one protruding step 41 included in the first conductor 4 includes a contact surface 42 parallel to the second surface 32 of the wiring board 3. The other end of the first conductor 4 is fixed to the second surface 32 of the wiring board 3 by the contact surface 42 and the second surface 32 of the wiring board 3 coming into close contact with each other.

When laser joining is performed between two flat plates, it is conceivable that variations occur in the joining strength between the flat plates at each laser joining position. Such joining may affect the reliability required of the semiconductor device 100. According to the semiconductor device 100 of the first preferred embodiment, the contact surface 42 of each protruding step 41 of the first conductor 4 is arranged parallel to the second surface 32 of the wiring board 3, and the contact surface 42 and the second surface 32 are reliably in contact with each other. Therefore, variations in the joining strength between the contact surface 42 of each protruding step 41 and the second surface 32 of the wiring board 3 are reduced. In addition, a wiring board 3 having a large heat capacity is provided between the first conductor 4 and the semiconductor element 2. The wiring board 3 prevents heat generated during laser joining from being transmitted to the semiconductor element 2, and prevents destruction due to heat of the semiconductor element 2. The semiconductor device 100 has desired joining strength and high reliability in the wiring of the first conductor 4.

The first surface 31 of the wiring board and the first electrode 21 of the semiconductor element 2, or the metal plate 1 and the second electrode 22 of the semiconductor element 2 included in the semiconductor device 100 in the first preferred embodiment are connected to each other via a bonding material containing Ag or Cu and having conductivity.

With this configuration, the bonding material 8 after sintering containing Ag or Cu has a melting point of 900° C. or more, and the semiconductor device 100 obtains high heat resistance and reliability.

The semiconductor device 100 according to the first preferred embodiment further includes another conductor (second conductor 5) different from the first conductor 4, the other conductor having a plate-like shape, one end of the other conductor being arranged to be connectable to an outside, one surface 5a side of another end of the other conductor being fixed to one surface 11 of the metal plate 1, the other conductor being wired to the second electrode 22 of the semiconductor element 2. The second conductor 5 includes at least one protruding step 51 on one surface 5a of the other end of the other conductor. The top portion of at least one protruding step 51 included in the second conductor 5 includes a contact surface 52 parallel to the one surface 11 of the metal plate 1. The other end of the second conductor 5 is fixed to the one surface 11 of the metal plate 1 by bringing the contact surface 52 of the second conductor 5 into close contact with the one surface 11 of the metal plate 1.

With this configuration, the contact surface 52 of the protruding step 51 of the second conductor 5 is arranged in parallel with the one surface 11 of the metal plate 1, and they come into contact with each other reliably. Therefore, variations in the joining strength between the contact surface 52 of the protruding step 51 and the one surface 11 of the metal plate 1 are reduced. In addition, the metal plate 1 and the second conductor 5 are joined in a desirable melted shape. The semiconductor device 100 obtains a desired joining strength, that is, stable joining.

The method for manufacturing the semiconductor device 100 according to the first preferred embodiment includes: preparing a metal plate 1, a semiconductor element 2 including a first electrode 21 provided on a front surface and a second electrode 22 provided on a back surface, the semiconductor element 2 being held on the metal plate 1 by the second electrode 22 being connected to the metal plate 1, a wiring board 3 including a first surface 31 and a second surface 32 facing each other, and a first conductor 4 having a plate-like shape; connecting the first surface 31 of the wiring board 3 to the first electrode 21 of the semiconductor element 2 in a facing manner; and arranging one end of the first conductor 4 so as to be connectable to an outside, fixing one end 4a side of another end of the first conductor 4 to the second surface 32 of the wiring board 3, and wiring the first conductor 4 to the first electrode 21 of the semiconductor element 2. The first conductor 4 includes at least one protruding step 41 on one surface 4a of the other end. A top portion of the at least one protruding step 41 included in the first conductor 4 includes a contact surface 42. The method includes: when fixing the one surface 4a side of the other end of the first conductor 4 to the second surface 32 of the wiring board 3, placing the first conductor 4 so that the contact surface 42 comes into contact with the second surface 32 of the wiring board 3 parallely, bringing the contact surface 42 of the first conductor 4 into close contact with the second surface 32 of the wiring board 3 by laser joining, and fixing the other end of the first conductor 4 to the second surface 32 of the wiring board 3.

According to the method for manufacturing the semiconductor device 100 according to the first preferred embodiment, the contact surface 42 of each protruding step 41 of the first conductor 4 is arranged parallel to the second surface 32 of the wiring board 3, and the contact surface 42 and the second surface 32 are reliably in contact with each other. Therefore, variations in the joining strength between the contact surface 42 of each protruding step 41 and the second surface 32 of the wiring board 3 are reduced. In addition, a wiring board 3 having a large heart capacity is provided between the first conductor 4 and the semiconductor element 2. The wiring board 3 prevents heat generated during laser joining from being transmitted to the semiconductor element 2, and prevents destruction due to heat of the semiconductor element 2. The semiconductor device 100 has desired joining strength and high reliability in the wiring of the first conductor 4.

The method for manufacturing a semiconductor device 100 according to the first preferred embodiment includes a step of performing laser joining with a laserbeam having a wavelength of 500 nm to 1200 nm oscillated from a fiber laser when laser-joining the contact surface 42 of the first conductor 4 and the second surface 32 of the wiring board 3.

With this configuration, conventional exterior treatment such as Ni plating or the like is unnecessary on the surface of the object to be joined. In addition, since the laser beam is efficiently absorbed, it is possible to perform laser joining by irradiating one junction with a laser beam for about several tens of ms to 1 s. Therefore, productivity can be improved and cost reduction can be achieved.

The method for manufacturing a semiconductor device 100 according to the first preferred embodiment includes a step of connecting the first surface 31 of the wiring board 3 and the first electrode 21 of the semiconductor element 2, or the metal plate 1 and the second electrode 22 of the semiconductor element 2 via a bonding material 8. The bonding material 8 is formed by sintering a sintered material containing Ag or Cu.

With this configuration, it is unnecessary to heat the semiconductor device 100 up to a high melting point like the conventional joining process, and occurrence of distortion or warp caused by thermal stress can be avoided. Since the bonding material 8 after sintering has a melting point of 900 degrees or more, remelting of the solder is prevented in the subsequent laser joining step, and furthermore, thermal breakdown of the semiconductor element 2 can be prevented. The semiconductor device 100 manufactured by joining using the sintered material has higher heat resistance and reliability than that using the solder bonding.

The method for manufacturing a semiconductor device 100 according to the first preferred embodiment includes: further preparing a second conductor 5 different from the first conductor 4, the second conductor 5 having a plate-like shape, arranging one end of the second conductor 5 so as to be connectable to an outside, fixing one surface 5a side of another end of the second conductor 5 to one surface 11 of the metal plate 1, and wiring the second conductor 5 to the second electrode 22 of the semiconductor element 2. The second conductor 5 includes at least one protruding step 51 on the one surface 5a of the other end of the second conductor 5. A top portion of the at least one protruding step 51 included in the second conductor 5 includes a contact surface 52 configured to come into contact with the one surface 11 of the metal plate 1. The method includes: when fixing the one surface 5a side of the other end of the second conductor 5 to the one surface 11 of the metal plate 1, placing the second conductor 5 so that the contact surface 52 of the second conductor 5 comes into contact with the one surface 11 of the metal plate 1 parallely, bringing the tact surface 52 of the second conductor 5 into close contact with the one surface 11 of the metal plate 1 by laser joining, and fixing the other end of the second conductor 5 to the one surface 11 of the metal plate 1.

With this configuration, the contact surface 52 of the protruding step 51 of the second conductor 5 is arranged in parallel with the one surface 11 of the metal plate 1, and they come into contact with each other reliably. Therefore, variations in the joining strength between the contact surface 52 of the protruding step 51 and the one surface 11 of the metal plate 1 are reduced. In addition, the metal plate 1 and the second conductor 5 are joined in a desirable melted shape. The semiconductor device 100 obtains a desired joining strength, that is, stable joining.

The method for manufacturing a semiconductor device 100 according to the first preferred embodiment includes a step of performing laser-joining with a laser beam having a wavelength of 500 nm to 1200 nm oscillated from a fiber laser when laser-joining the contact surface 52 of the second conductor 5 and the one surface 11 of the metal plate 1.

The laser beam having a wavelength of 500 nm to 1200 nm oscillated from the above fiber laser is efficiently absorbed by Cu or alloy containing Cu forming the second conductor 5. Therefore, conventional exterior treatment such as Ni plating or the like is unnecessary on the surface of the object to be joined. In addition, since the laser beam is efficiently absorbed, it is possible to perform laser joining by irradiating one junction with a laser beam for about several tens of ms to 1 s. Therefore, productivity can be improved and cost reduction can be achieved.

Second Preferred Embodiment

The semiconductor device and the method for manufacturing the semiconductor device in a second preferred embodiment will be described.

Figure 7:
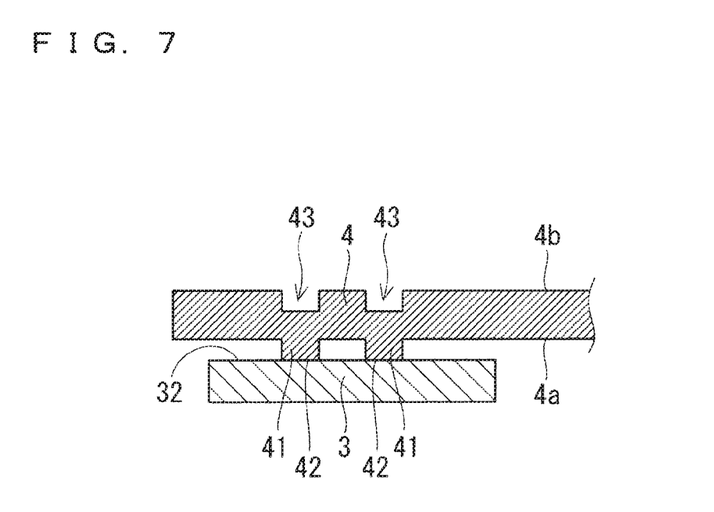
FIG. 7 is an enlarged cross-sectional view showing the configuration of another end of a first conductor in a second preferred embodiment.
Figure 8:
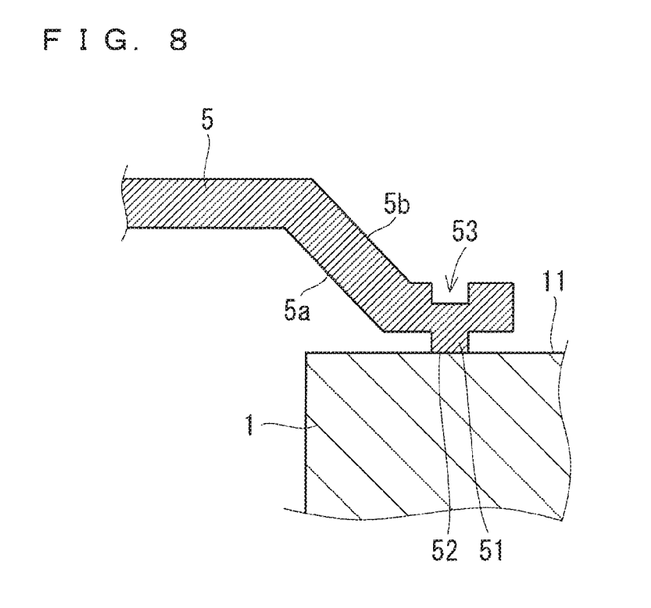
FIG. 8 is an enlarged cross-sectional view showing the configuration of another end of a second conductor in the second preferred embodiment.

FIG. 7 is an enlarged cross-sectional view showing the configuration of the other end of the first conductor 4 in the second preferred embodiment. FIG. 8 is an enlarged cross-sectional view showing the configuration of the other end of the second conductor 5 in the second preferred embodiment. Other configurations are similar to those of the semiconductor device 100 in the first preferred embodiment.

The first conductor 4 in the second preferred embodiment includes a recessed step 43 in a position corresponding to each protruding step 41 on the other surface 4b. It should be noted that the other surface 4b is a surface on the opposite side from the side of the one surface 4a on which the contact surface 42 is positioned. The contact surface 42 positioned in the top portion of each protruding step 41 included in the first conductor 4 is parallely in close contact with the second surface 32 of the wiring board 3.

Similarly, the second conductor 5 includes a recessed step 53 in a position corresponding to the protruding step 51 on the other surface 5b. The contact surface 52 positioned in the top portion of the protruding step 51 included in the second conductor 5 is parallely in contact with the one surface 11 of the metal plate 1.

In step S4 of the method for manufacturing a semiconductor device shown in FIG. 5, the other surface 4b of the first conductor 4 is provided with the recessed step 43, whereby the laser joining device can automatically recognize the position to be laser-joined from the other surface 4b side by image processing. The laser joining device can accurately apply laser energy to the recognized position. As a result, it is possible to obtain a favorable joining shape and joining strength, or to reduce junction variation. Automating the laser joining process in step S4 stabilizes the manufacturing process of the semiconductor device 100 and improves productivity. The same applies to the laser joining of the contact surface 52 of the second conductor 5 and the one surface 11 of the metal plate 1 in step S6.

Third Preferred Embodiment

The semiconductor device and the method for manufacturing the semiconductor device in a third preferred embodiment will be described. It should be noted that descriptions of configurations and operations similar to those in the first or second preferred embodiment will be omitted.

Figure 9:
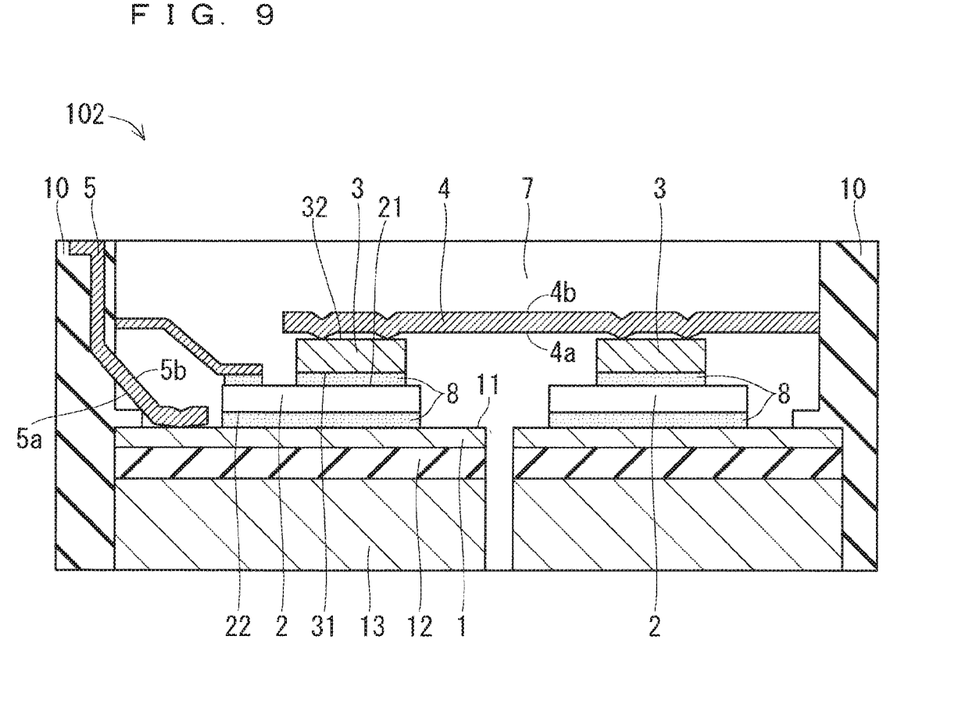
FIG. 9 is a cross-sectional view showing the configuration of a semiconductor device in a third preferred embodiment.
Figure 10:
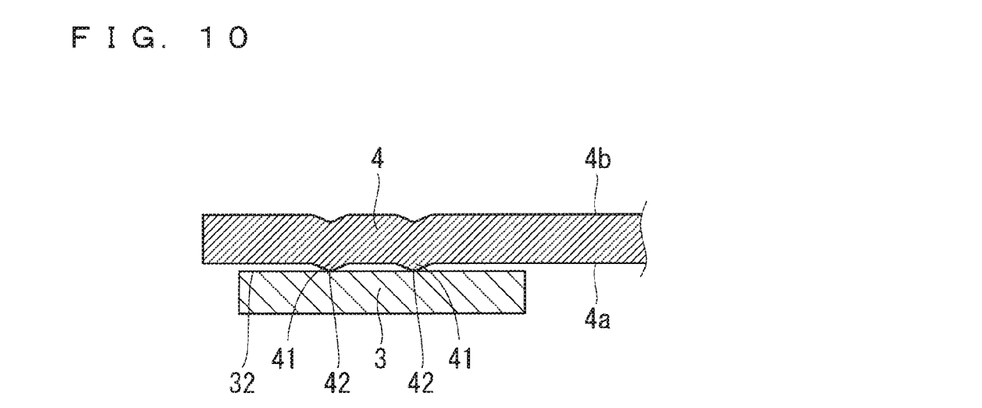
FIG. 10 is an enlarged cross-sectional view showing the configuration of another end of a first conductor in the third preferred embodiment.

FIG. 9 is a cross-sectional view showing the configuration of a semiconductor device 102 in a third preferred embodiment. FIG. 10 is an enlarged cross-sectional view showing the configuration of the other end of the first conductor 4 in the third preferred embodiment.

As shown in FIG. 10, each protruding step 41 included in the first conductor 4 has a protrusion shape. A contact surface 42 to be in close contact with the second surface 32 of the wiring board 3 is positioned in the top portion of the protrusion shape. Although not shown, the second conductor 5 also has the same configuration.

As shown in FIG. 9, in the semiconductor device 102 in the third preferred embodiment, the heat sink 6 is not provided, and the configuration of the metal plate 1 and the layer lower than the metal plate 1 is different from the configuration of the first preferred embodiment. A circuit pattern (not shown) is formed on the one surface 11 of the metal plate 1, and the semiconductor element 2 is connected corresponding to the circuit pattern. In the semiconductor device 102, an insulating layer 12 is provided on the lower surface positioned on the opposite side from the one surface 11 of the metal plate 1 which holds the semiconductor element 2 and to which the second wiring line is connected, and furthermore, a metal layer 13 is provided in the lower layer of the insulating layer 12. The insulating layer 12 is made of $Si_3N_4$, AlN, or $Al_2O_3$. The metal layer 13 is made of Cu having a thickness of 2 to 7 mm, and the heat capacity thereof is secured. In addition, the semiconductor element 2, the metal plate 1, the first conductor 4, the second conductor 5, and the like are arranged so as to be included in the case 10, and the inside of the case 10 is sealed with the sealing material 7. The case 10 is formed of polyethylene terephthalate (PPT), polybutylene terephthalate (PBT), or the like. The sealing material 7 is a resin mainly made of silicone or an epoxy resin.

In the method for manufacturing the semiconductor device 102, the protrusion shape of the first conductor 4 is formed by an easy method such as press work or the like. The method of joining the first conductor 4 and the wiring board 3 and the method of joining the second conductor 5 and the metal plate 1 are the same as those in the first preferred embodiment.

Fourth Preferred Embodiment

The semiconductor device and the method for manufacturing the semiconductor device in a fourth preferred embodiment will be described. It should be noted that descriptions of configurations and operations similar to those of the other preferred embodiments will be omitted.

Figure 11:
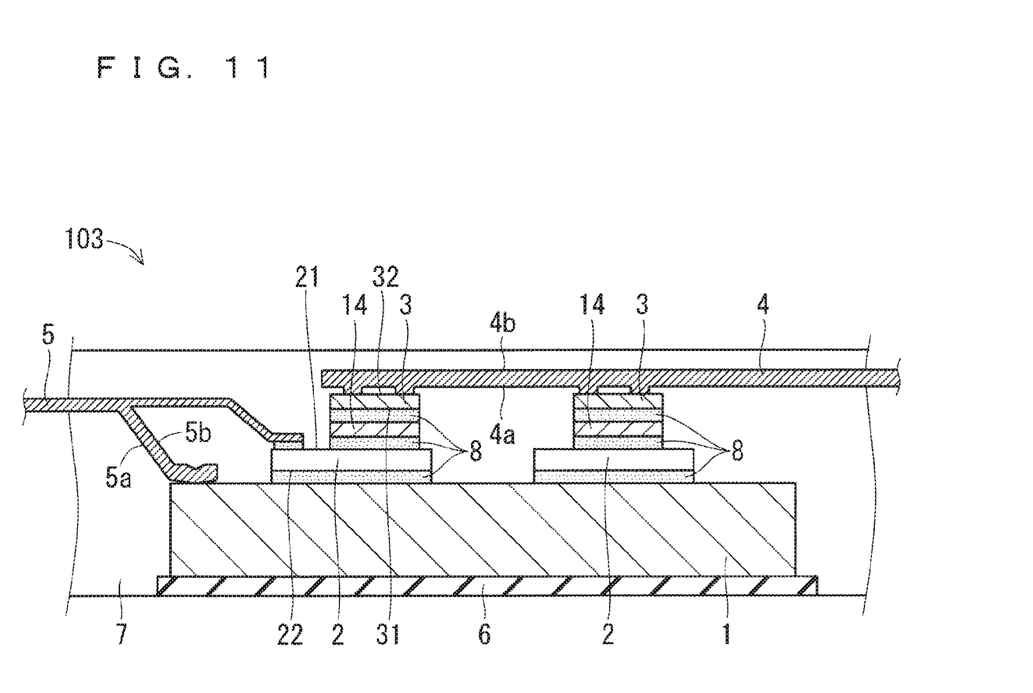
FIG. 11 is a cross-sectional view showing the configuration of a semiconductor device in a fourth preferred embodiment.

FIG. 11 is a cross-sectional view showing the configuration of a semiconductor device 103 in a fourth preferred embodiment. In the semiconductor device 103, at least one connection plate 14 made of metal is provided between the first electrode 21 of the semiconductor element 2 and the wiring board 3 for fixing the first conductor 4. In the fourth preferred embodiment, one connection plate 14 is provided. The connection plate 14 may have the same configuration as the wiring board 3. That is, the connection plate 14 has conductivity and is made of, for example, copper or copper alloy. The thickness of the connection plate 14 is preferably 0.1 μm to several mm. The connection plate 14 and the second electrode 22 of the semiconductor element 2 are connected via the bonding material 8, and similarly the connection plate 14 and the first surface 31 of the wiring board 3 are connected via the bonding material 8.

The bonding material 8 in the fourth preferred embodiment has conductivity and contains Sn as a main component. The bonding material 8 contains a Cu—Sn based intermetallic compound and has high heat resistance. In addition, the bonding material 8 may contain a resin component. The mixed resin component reduces the modulus of elasticity of the bonding material 8 and alleviates thermal strain or thermal stress. The bonding material 8 of the semiconductor device 100 described in the first preferred embodiment may be the same as the above-described configuration. That is, the first surface 31 of the wiring board 3 and the first electrode 21 of the semiconductor element 2, or the one surface 11 of the metal plate 1 and the second electrode 22 of the semiconductor element 2 may be connected via a bonding material 8 containing Sn and having conductivity. In addition, conversely, the bonding material in the fourth preferred embodiment may be the bonding material 8 containing Ag or Cu described in the first preferred embodiment.

In the fourth preferred embodiment, the connection plate 14 is prepared in step S1 of the method for manufacturing the semiconductor device shown in FIG. 5. Then, before step S2, the connection plate 14 is connected onto the first electrode 21 of the semiconductor element 2. Here, the connection plate 14 is bonded onto the first electrode 21 with the above-described bonding material.

In step S2, the first surface 31 of the wiring board 3 is connected to the first electrode 21 of the semiconductor element 2 in a facing manner. In the fourth preferred embodiment, the first surface 31 of the wiring board. 3 is connected to the first electrode 21 of the semiconductor element 2 via the bonding material 8 and the connection plate 14. At that time, the bonding material 8 containing Sn is formed by liquid phase diffusion bonding of an insert material containing Sn.

To summarize the above, the semiconductor device 100 in the fourth preferred embodiment further includes at least one connection plate 14 made of metal between the first electrode 21 of the semiconductor element 2 and the wiring board 3 for fixing the first conductor 4.

With this configuration, heat generated during laser joining is less likely to be transmitted to the semiconductor element 2 by the wiring board 3 and the connection plate 14. The reliability of the semiconductor element 2 is improved. In addition, stable joining can be obtained by laser joining, and the reliability of the semiconductor device 100 is improved.

Fifth Preferred Embodiment

The semiconductor device and the method for manufacturing the semiconductor device in a fifth preferred embodiment will be described. It should be noted that descriptions of configurations and operations similar to those of the other preferred embodiments will be omitted.

Figure 12:
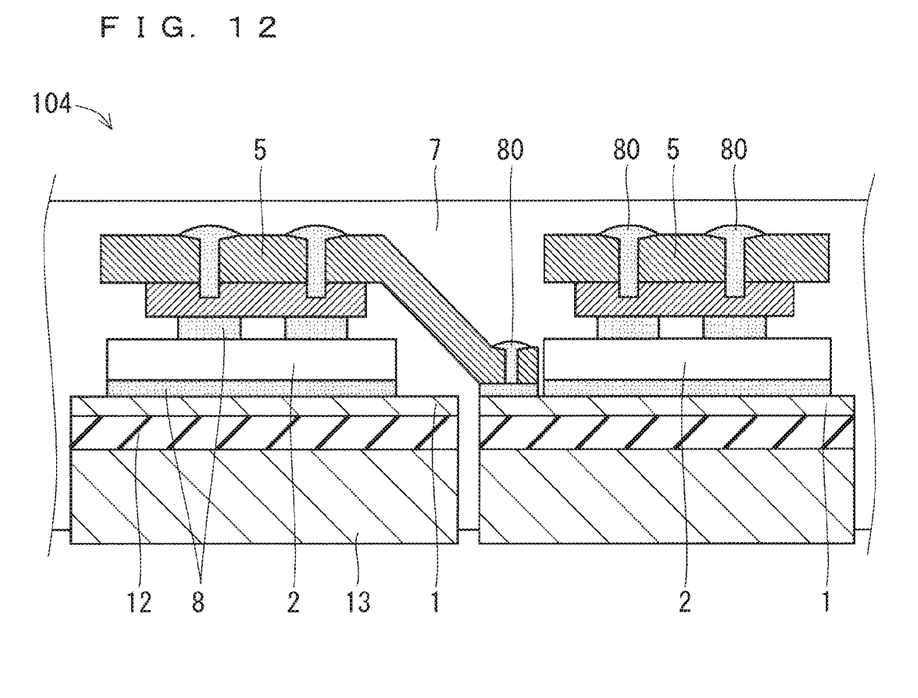
FIG. 12 is a cross-sectional view showing the configuration of a semiconductor device in a fifth preferred embodiment.
Figure 13:
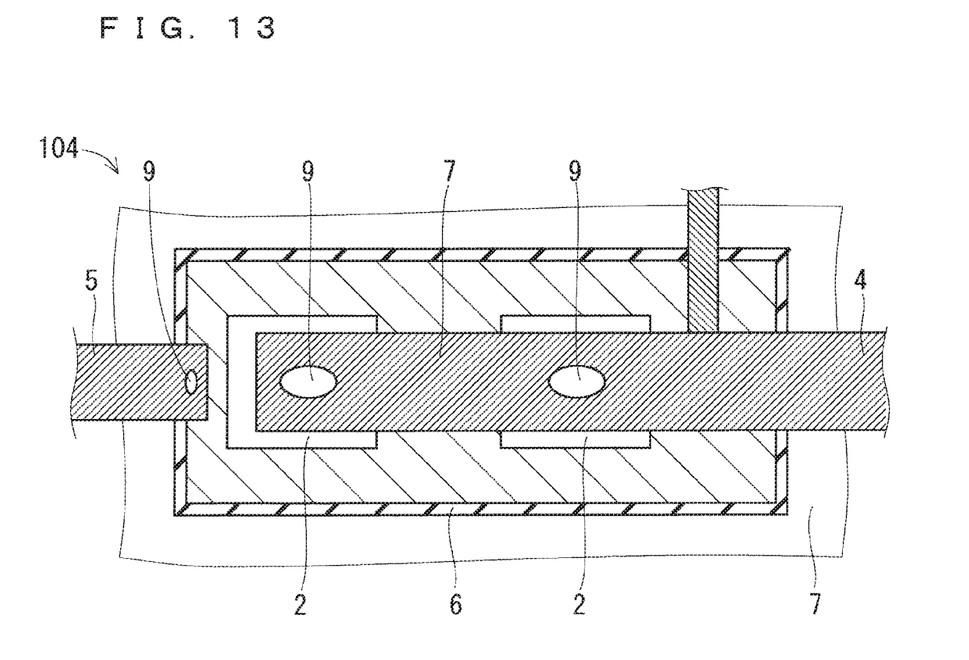
FIG. 13 is a top view showing the configuration of the semiconductor device in the fifth preferred embodiment.

FIG. 12 is a cross-sectional view showing the configuration of a semiconductor device 104 in a fifth preferred embodiment. FIG. 13 is a top view showing the configuration of the semiconductor device 104 in the fifth preferred embodiment. The first conductor 4 includes a through hole 9 provided in the contact surface 42 of the protruding step of the first conductor 4. The contact surface 42 of the first conductor 4 is in close contact with the second surface 32 of the wiring board 3 continuously along the outer periphery of the through hole 9. Similarly, the second conductor 5 includes a through hole 9 provided in the contact surface 42 of the protruding step of the second conductor 5. The contact surface 42 of the second conductor 5 is in close contact with the one surface 11 of the metal plate 1 continuously along the outer periphery of the through hole 9.

In the method for manufacturing the semiconductor device 100 in the fifth preferred embodiment, the laser beam is applied around the through hole 9 during laser joining. Similarly to the method for manufacturing the semiconductor device 100 of the second preferred embodiment, in the laser joining process, since the laser joining device can grasp the position to be joined by image processing or the like, the contact surface 42 of the first conductor 4 or the contact surface 42 of the second conductor 5 can be accurately irradiated with a laser beam. As a result, it is possible to obtain a joint having good strength. In addition, the laser joining process can be automated, and the productivity is improved. As shown in FIG. 13, the size of the through hole 9 after joining is small.

It should be noted that in the present invention, preferred embodiment can be freely combined, and each embodiment can be appropriately modified, or omitted within the scope of the present invention. Although the present invention is described in detail, the above description is, in all preferred embodiments, illustrative, and the present invention is not limited to the above description. It is understood that innumerable modifications not illustrated can be envisaged without departing from the scope present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a metal plate;
   a semiconductor element including a first electrode provided on a front surface and a second electrode provided on a back surface, the semiconductor element being held on the metal plate by the second electrode being connected to the metal plate;
   a wiring board including a first surface and a second surface facing each other, the first surface being connected to the first electrode of the semiconductor element in a facing manner; and
   a conductor having a plate-like shape, one end of the conductor being arranged to be connectable to an outside, one surface side of another end of the conductor being fixed to the second surface of the wiring board, the conductor being wired to the first electrode of the semiconductor element, wherein
   the conductor includes at least one protruding step on the one surface of the other end,
   a top portion of the at least one protruding step included in the conductor includes a contact surface parallel to the second surface of the wiring board, and
   the other end of the conductor is fixed to the second surface of the wiring board by the contact surface and the second surface of the wiring board coming into close contact with each other.

2. The semiconductor device according to claim 1, wherein the conductor includes a recessed step in a position on another surface corresponding to the at least one protruding step of the one surface.

3. The semiconductor device according to claim 1, wherein the conductor includes a through hole provided in the contact surface of the conductor.

4. The semiconductor device according to claim 3, wherein the contact surface of the conductor comes into close contact with the second surface of the wiring board continuously along an outer periphery of the through hole.

5. The semiconductor device according to claim 1, wherein the first surface of the wiring board and the first electrode of the semiconductor element, or the metal plate and the second electrode of the semiconductor element are connected to each other via a bonding material containing Ag, Cu, or Sn and having conductivity.

6. The semiconductor device according to claim 1, further comprising at least one connection plate made of metal between the first electrode of the semiconductor element and the wiring board configured to fix the conductor.

7. The semiconductor device according to claim 6, wherein the connection plate and the first electrode of the semiconductor element, or the connection plate and the wiring board are connected to each other via a bonding material containing Ag, Cu, or Sn and having conductivity.

8. The semiconductor device according to claim 1, further comprising another conductor different from the conductor, the other conductor having a plate-like shape, one end of the other conductor being arranged to be connectable to an outside, one surface side of another end of the other conductor being fixed to one surface of the metal plate, the other conductor being wired to the second electrode of the semiconductor element, wherein
the other conductor includes at least one protruding step on one surface of the other end of the other conductor,
a top portion of the at least one protruding step included in the other conductor includes a contact surface parallel to the one surface of the metal plate, and
the other end of the other conductor is fixed to the one surface of the metal plate by the contact surface of the other conductor and the one surface of the metal plate coming into close contact with each other.

9. The semiconductor device according to claim 8, wherein the other conductor includes a recessed step in a position on another surface corresponding to the at least one protruding step of the one surface of the other conductor.

10. The semiconductor device according to claim 8, wherein the other conductor includes a through hole provided in the contact surface of the other conductor.

11. The semiconductor device according to claim 10, wherein the contact surface of the other conductor comes into close contact with the one surface of the metal plate continuously along an outer periphery of the through hole provided in the contact surface of the other conductor.

12. A method for manufacturing a semiconductor device, the method comprising:
preparing a metal plate, a semiconductor element including a first electrode provided on a front surface and a second electrode provided on a back surface, the semiconductor element being held on the metal plate by the second electrode being connected to the metal plate, a wiring board including a first surface and a second surface facing each other, and a conductor having a plate-like shape;
connecting the first surface of the wiring board to the first electrode of the semiconductor element in facing manner; and
arranging one end of the conductor so as to be connectable to an outside, fixing one surface side of another end of the conductor to the second surface of the wiring board, and wiring the conductor to the first electrode of the semiconductor element, wherein
the conductor includes at least one protruding step on the one surface of the other end,
a top portion of the at least one protruding step included in the conductor includes a contact surface, and
the step of fixing the one surface side of the other end of the conductor to the second surface of the wiring board includes
placing the conductor so that the contact surface comes into contact with the second surface of the wiring board parallely,
bringing the contact surface of the conductor into close contact with the second surface of the wiring board by laser joining the contact surface of the conductor and the second surface of the wiring board, and fixing the other end of the conductor to the second surface of the wiring board.

13. The method for manufacturing a semiconductor device according to claim 12, wherein the conductor includes a recessed step in a position on another surface corresponding to the at least one protruding step of the one surface.

14. The method for manufacturing a semiconductor device according to claim 12, wherein the conductor includes a through hole provided in the contact surface of the conductor.

15. The method for manufacturing a semiconductor device according to claim 14, further comprising a step of bringing the contact surface of the conductor into close contact with the second surface of the wiring board by laser joining continuously along an outer periphery of the through hole.

16. The method for manufacturing a semiconductor device according to claim 12, wherein in the step of laser joining the contact surface of the conductor and the second surface of the wiring board, a laser beam for laser joining has a wavelength of 500 nm to 1200 nm and is oscillated from a fiber laser.

17. The method for manufacturing a semiconductor device according to claim 12, further comprising a step of connecting the first surface of the wiring board and the first electrode of the semiconductor element, or the metal plate and the second electrode of the semiconductor element via a bonding material,
wherein the bonding material is formed by sintering a sintered material containing Ag or Cu, or formed by liquid phase diffusion bonding of an insert material containing Sn.

18. The method for manufacturing a semiconductor device according to claim 12, further comprising a step of further connecting at least one connection plate made of metal between the first electrode of the semiconductor element and the wiring board configured to fix the conductor.

19. The method for manufacturing a semiconductor device according to claim 18, further comprising a step of connecting the connection plate and the first electrode of the semiconductor element, or the connection plate and the wiring board via a bonding material,
wherein the bonding material is formed by sintering a sintered material containing Ag or Cu, or formed by liquid phase diffusion bonding of an insert material containing Sn.

20. The method for manufacturing a semiconductor device according to claim 12, farther comprising:
further preparing another conductor having a plate-like shape, the other conductor different from the conductor: and arranging one end of the other conductor so as to be connectable to an outside, fixing one surface side of another end of the other conductor to one surface of the metal plate, and wiring the other conductor to the second electrode of the semiconductor element, wherein the other conductor includes at least one protruding step on the one surface of the other end of the other conductor, a top portion of the at least one protruding step included in the other conductor includes a contact surface configured to come into contact with the one surface of the metal plate, and the step of fixing the one surface side of the other end of the other conductor to the one surface of the metal plate includes placing the other conductor so that the contact surface of the other conductor comes into contact with the one surface of the metal plate parallely, bringing the contact surface of the other conductor into close contact with the one surface of the metal plate by laser joining the contact surface of the other conductor and the one surface of the metal plate, and fixing the other end of the other conductor to the one surface of the metal plate.

21. The method for manufacturing a semiconductor device according to claim 20, wherein the other conductor includes a recessed step in a position on another surface corresponding to the at least one protruding step of the one surface of the other conductor.

22. The method for manufacturing a semiconductor device according to claim 20, wherein the other conductor includes a through hole provided in the contact surface of the other conductor.

23. The method for manufacturing a semiconductor device according to claim 22, further comprising a step of bringing the contact surface of the other conductor into close contact with the one surface of the metal plate by laser joining continuously along an outer periphery of the through hole provided in the contact surface of the other conductor.

24. The method for manufacturing a semiconductor device according to claim 20, wherein in the step of laser joining the contact surface of the other conductor and the one surface of the metal plate, a laser beam for laser joining has a wavelength of 500 nm to 1200 nm and is oscillated from a fiber laser.

* * * * *